United States Patent [19]
Furuno et al.

[11] Patent Number: 5,661,639
[45] Date of Patent: Aug. 26, 1997

[54] STRUCTURE FOR ATTACHING A HEAT SINK TO A SEMICONDUCTOR DEVICE

[75] Inventors: Satoshi Furuno; Koichi Inoue, both of Kyoto, Japan

[73] Assignee: Rohm Co., Ltd., Kyoto, Japan

[21] Appl. No.: 547,524

[22] Filed: Oct. 24, 1995

[30] Foreign Application Priority Data

Oct. 25, 1994 [JP] Japan .................................. 6-259963

[51] Int. Cl.⁶ .................................................. H05K 7/20
[52] U.S. Cl. ..................... 361/704; 165/80.2; 165/80.3; 165/185; 257/707; 257/713; 257/718; 257/797; 361/717; 361/718; 361/722
[58] Field of Search ...................... 165/80.2, 80.3, 165/185; 174/16.3; 257/706, 707, 675, 712, 713, 718–722, 726–727, 797; 361/704, 707, 709–710, 714–715, 717–718, 722, 723, 807, 809–811

[56] References Cited

U.S. PATENT DOCUMENTS

| | | | |
|---|---|---|---|
| 4,460,917 | 7/1984 | Rogers | 174/16.3 |
| 4,646,203 | 2/1987 | Ngo et al. | 174/16.3 |
| 4,710,852 | 12/1987 | Keen | 174/16.3 |
| 5,175,668 | 12/1992 | Kendel | 361/720 |
| 5,488,539 | 1/1996 | Testa et al. | 361/720 |

FOREIGN PATENT DOCUMENTS

| | | | |
|---|---|---|---|
| 0489958 | 6/1992 | European Pat. Off. | 171/16.3 |
| 7099762 | 6/1982 | Japan | 257/718 |
| 1-293544 | 11/1989 | Japan | 257/718 |
| 2087654 | 3/1990 | Japan | 257/727 |

*Primary Examiner*—Gregory D. Thompson
*Attorney, Agent, or Firm*—Nikaido Marmelstein Murray & Oram LLP

[57] ABSTRACT

In a structure for attaching a heat sink to a semiconductor device in which a frame is encapsulated in a resin mold, a pin is formed integrally with the semiconductor device, and a hole engageable with the pin is formed integrally with the heat sink.

13 Claims, 18 Drawing Sheets

(1) 5,661,639

STRUCTURE FOR ATTACHING A HEAT SINK TO A SEMICONDUCTOR DEVICE

BACKGROUND OF THE INVENTION

1. Field of the Invention

The present invention relates to a structure for attaching a heat sink to a semiconductor device, and more specifically, to a structure for attaching a heat sink to a semiconductor, employed for semiconductor products such as integrated circuits (ICs).

2. Description of the Prior Art

FIG. 1 is a perspective view showing a conventional heat sink attaching structure in a condition where a heat sink 4 has been attached. FIG. 2 is a side view thereof. In a semiconductor device 1, a frame 3 having an IC chip (not shown) mounted thereon is encapsulated in a resin mold 2. The resin mold 2 and the heat sink 4 respectively have a hole 1a and a hole 4a formed therein (see FIG. 2). To attach the heat sink 4 to the semiconductor device 1, a screw 5 is inserted into the holes 1a and 4b and tightened by a nut 6. The circuit board for fixing the semiconductor device 1 thereonto is sometimes used also as the heat sink 4.

Since the screw 5 and the holes 1a and 4a are all small, the attachment of the heat sink 4 to the semiconductor 1 is very troublesome. In addition, a number of processes are required to couple the screw 5 and the nut 6. Consequently, the work efficiency is low and the manufacture cost is increased thereby.

SUMMARY OF THE INVENTION

An object of the present invention is to provide a structure for attaching a heat sink to a semiconductor device which enables a reduction in work process, an improvement in manufacture efficiency and a reduction in manufacture cost.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
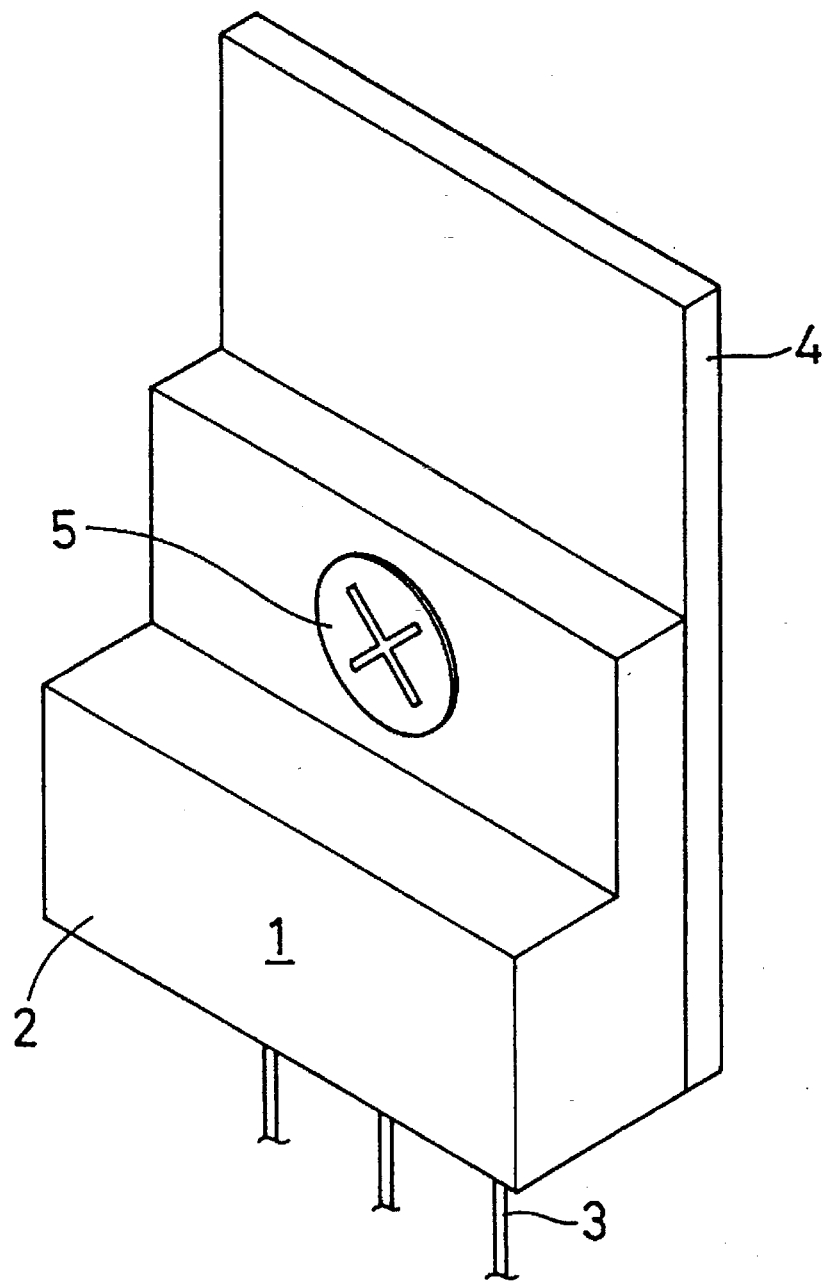
FIG. 1 is a perspective view showing the appearance of a conventional structure.
Figure 2:
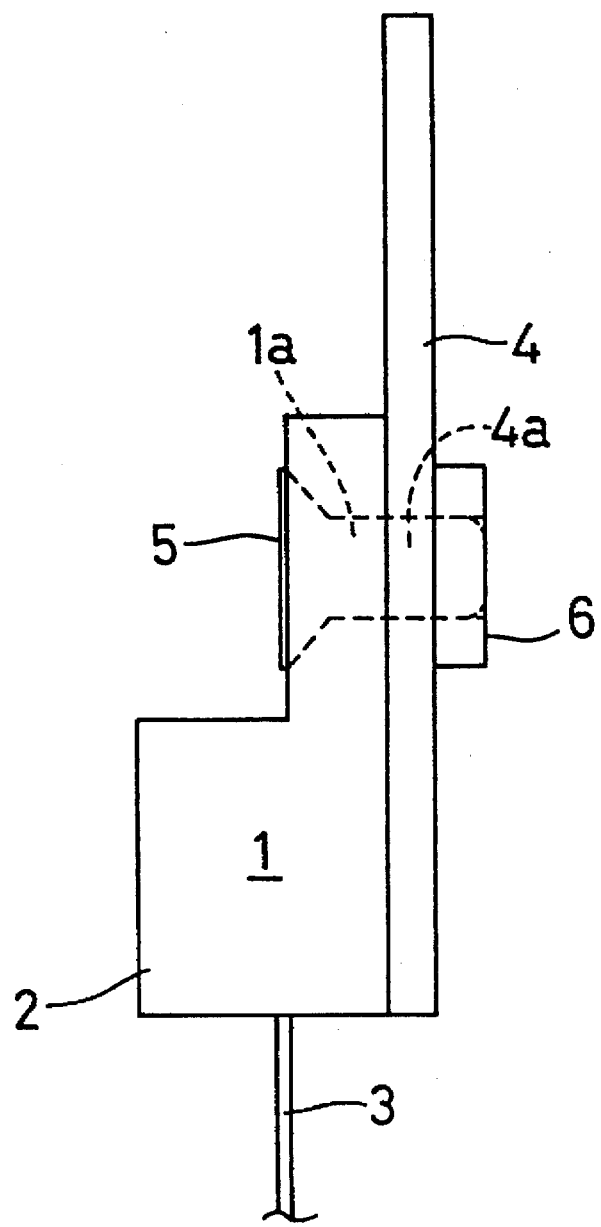
FIG. 2 is a side view of the conventional structure.

Hereinafter, structures for attaching a heat sink to a semiconductor device, embodying the present invention will be described with reference to the drawings. Portions and elements the same as or corresponding to those of the conventional structure of FIGS. 1 and 2 and portions and elements common to the subsequently-described embodiments are identified by the same reference designations and will not be described in detail. The heat sink is made of a metal such as aluminum. The heat sink is attached to a semiconductor device. As another mode, the heat sink is mounted on a semiconductor device.

Figure 3A:
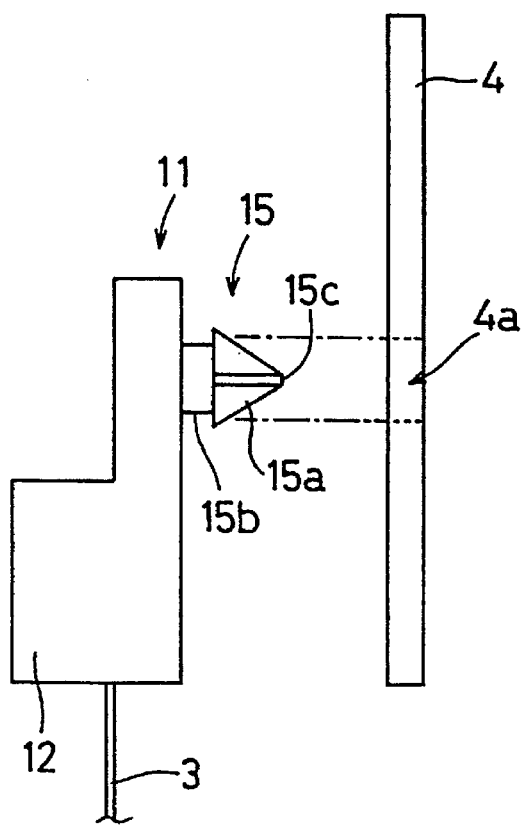
FIGS. 3A and 3B are sides views showing conditions before and after the attachment in a first embodiment of the present invention.
Figure 3B:
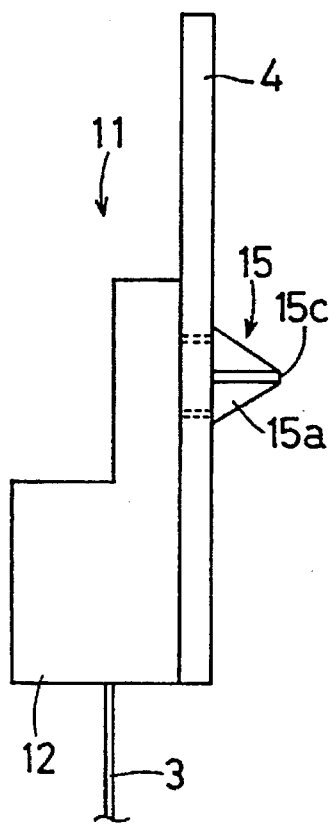

FIGS. 3A and 3B are side views respectively showing a condition before the attachment and a condition after the attachment in a first embodiment of the present invention. In order to attach a heat sink 4 to a semiconductor device 11 in which a frame 3 is encapsulated in a resin mold 12 (made of e.g. epoxy resin), the first embodiment has a structure such that a pin 15 is formed integrally with the resin mold 12 and a hole 4a engageable with the pin 15 is formed in the heat sink 4.

Figure 4:
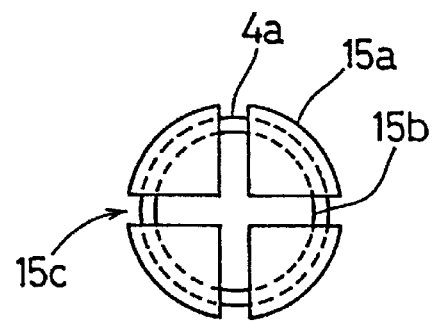
FIG. 4 is a front view showing a relevant portion in the condition after the attachment in the first embodiment.

The pin 15 consists of a head 15a and a trunk 15b thinner than the head 15a. The head 15a which is overall wedge-shaped is divided into four parts by a gap 15c as shown in FIG. 4. In order that the size of the gap 15c is variable, the head 15a is made of a flexible material. The gap 15c narrows when the head 15a is inserted into the hole 4a. When the head 15a sticks out of the rear surface of the heat sink 4 as shown in FIG. 3B, the gap 15c returns to the original size to complete the engagement between the pin 15 and the hole 4a. As a result, the heat sink 4 is integrated with the semiconductor device 11 by being sandwiched between the head 15a and the resin mold 12. The head 15a may be divided into two parts by the gap 15c.

Since the pin 15 formed on the resin mold 12 and the hole 4a formed in the heat sink 4 are thus engageable, the heat sink 4 is attached to the semiconductor device 11 in a single process. If the number of holes 4a and pins 15 engageable therewith is increased, the heat sink 4 will be more stably attached to the semiconductor device 11.

Figure 5:
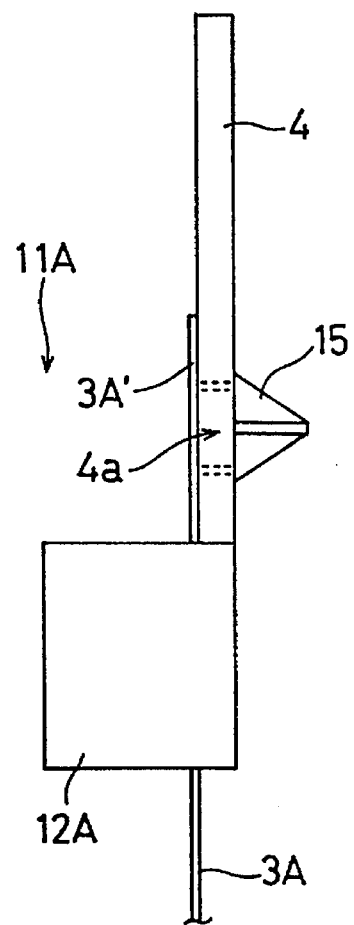
FIG. 5 is a side view showing a condition after the attachment in a second embodiment of the present invention.

FIG. 5 is a side view showing a condition after the attachment in a second embodiment of the present invention. In a semiconductor device 11A of this embodiment, a frame 3A for electrical connection protrudes out of a resin mold 12A (made of e.g. epoxy resin), and a frame 3A' and the frame 3A protrude in opposite directions. In order to attach the heat sink 4 to the frame 3A', the second embodiment has a structure such that the pin 15 is formed integrally with the frame 3A' and the hole 4a engageable with the pin 15 is formed integrally with the heat sink 4.

Since the pin 15 formed on the frame 3A' and the hole 4a formed in the heat sink 4 are thus engageable, the heat sink 4 is attached to the semiconductor device 11A in a single process. In addition, since the heat sink 4 is attached so as to be directly in contact with the frame 3A' an IC chip mounted thereon, heat is more effectively released from the semiconductor device 11A. A hole may be formed in the frame 3A' so that a hook pin is inserted into the hole and the hole 4a of the heat sink 4 to attach the heat sink 4 to the frame 3A'. In that case, it is unnecessary to previously form the pin 15 integrally with the frame 3A'.

Figure 6:
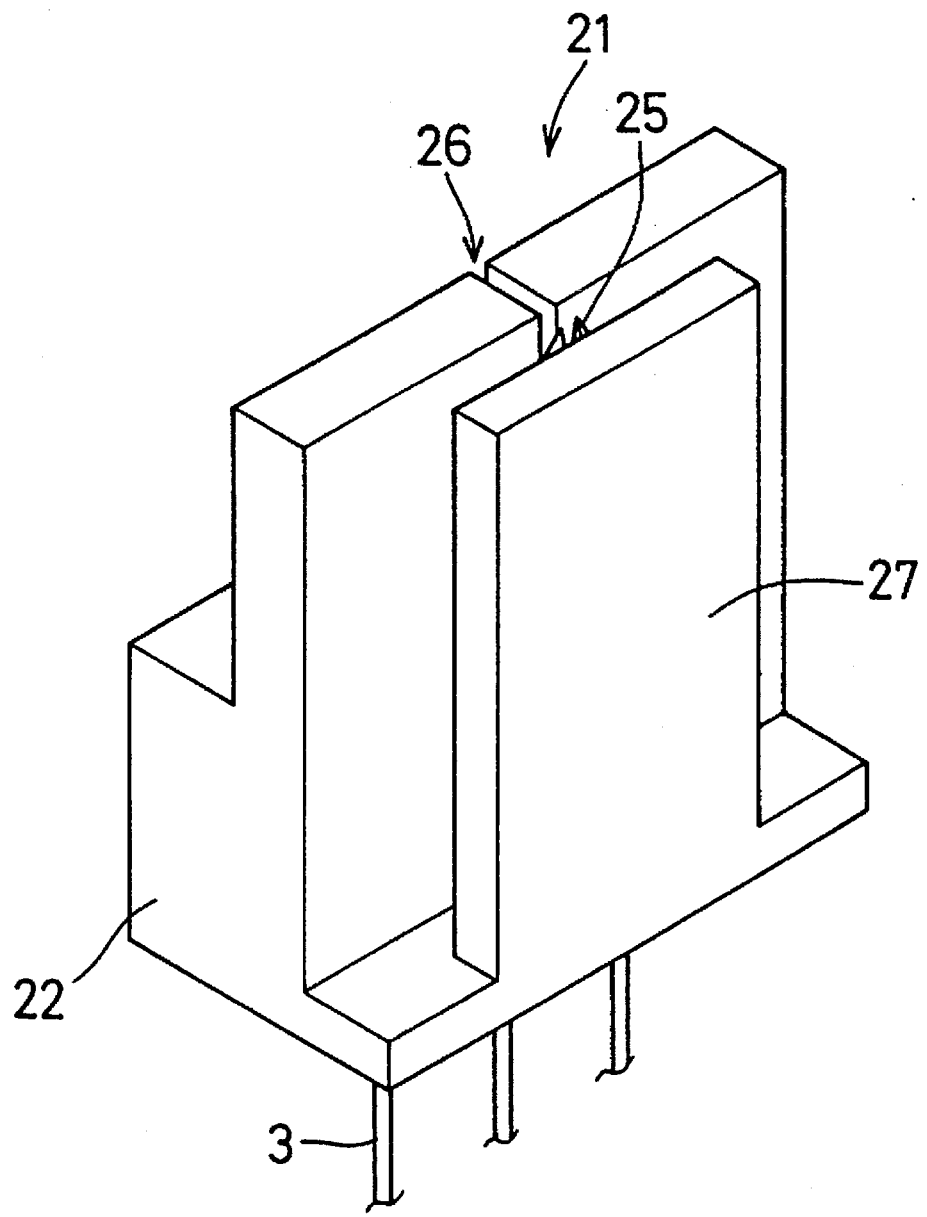
FIG. 6 is a perspective view of a semiconductor device of a third embodiment of the present invention.
Figure 7:
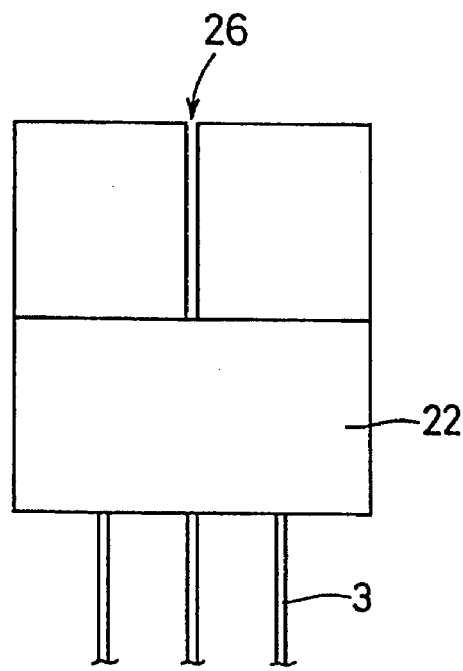
FIG. 7 is a front view of the semiconductor device of the third embodiment.
Figure 8:
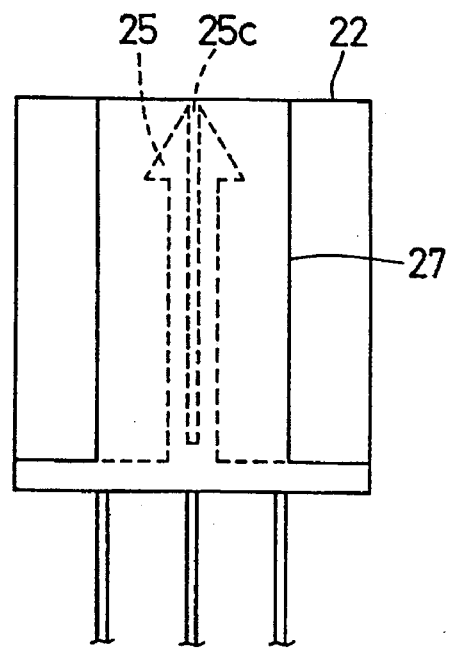
FIG. 8 is a rear view of the semiconductor device of the third embodiment.
Figure 9:
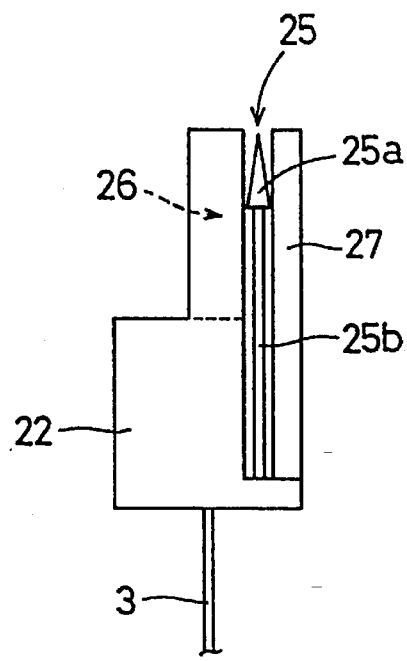
FIG. 9 is a side view of the semiconductor device of the third embodiment.
Figure 10:
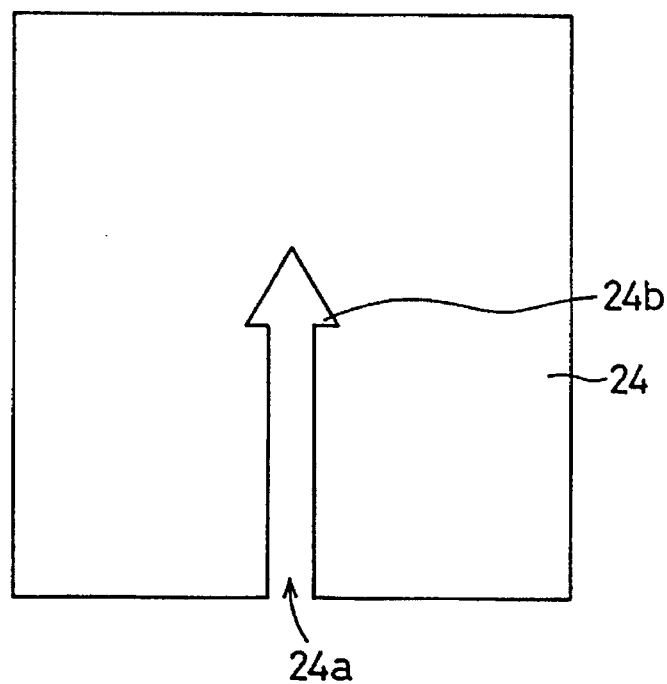
FIG. 10 is a front view of a heat sink of the third embodiment.
Figure 11:
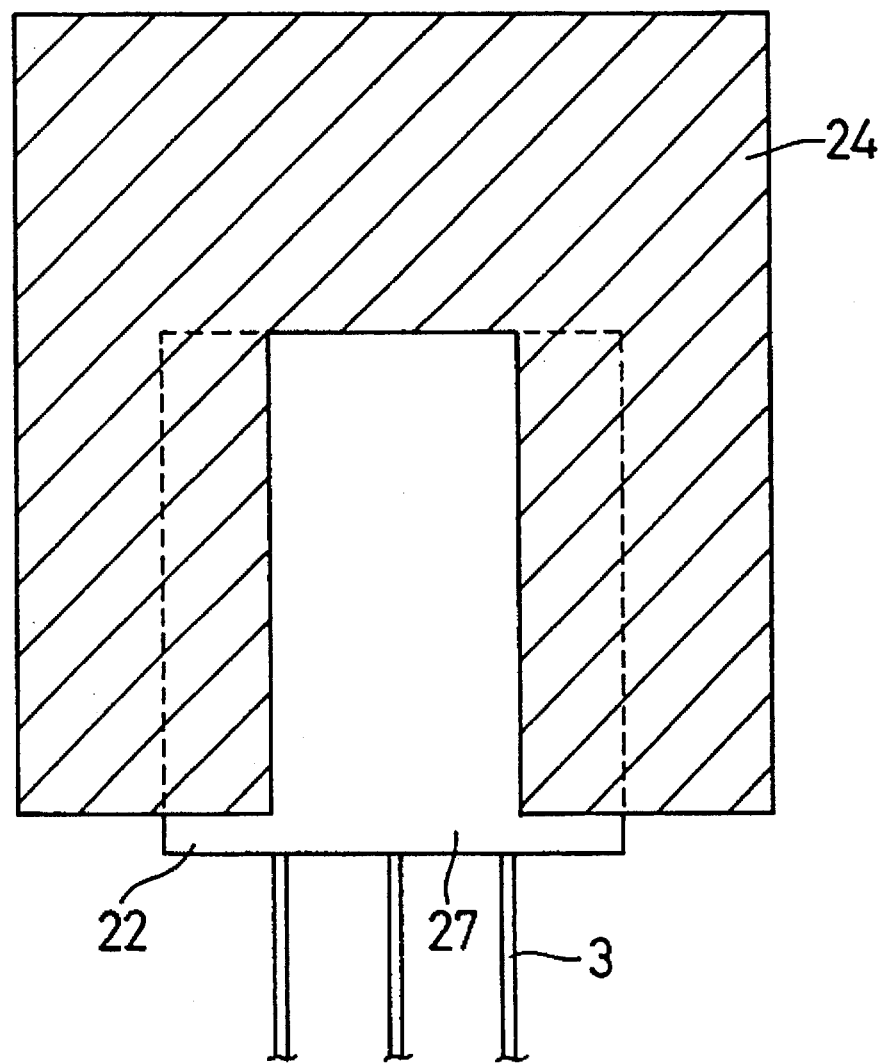
FIG. 11 is a front view showing a condition after the attachment in the third embodiment.
Figure 12:
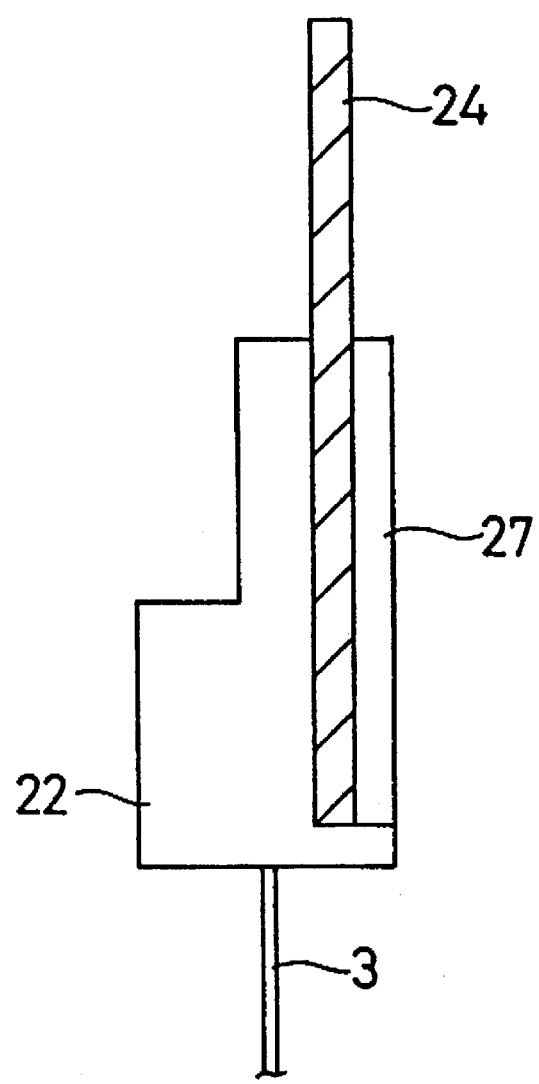
FIG. 12 is a side view showing the condition after the attachment in the third embodiment.

FIG. 6 is a perspective view of a semiconductor device 21 of a third embodiment of the present invention. FIG. 7 is a front view thereof. FIG. 8 is a rear view thereof. FIG. 9 is a side view thereof. FIG. 10 is a front view of a heat sink 24 of the third embodiment. FIGS. 11 and 12 are a rear view and a side view showing a condition after the attachment in the third embodiment. In order to attach the heat sink 24 to the semiconductor device 21 in which the frame 3 is encapsulated in a resin mold 22 (made of e.g. epoxy resin), the third embodiment has a structure such that a hook 25 and a back 27 are formed integrally with the resin mold 22 and a slit 24a engageable with the hook 25 is formed integrally with the heat sink 24.

The hook 25 consists of a head 25a and a trunk 25b (FIG. 9). The hook 25 is divided into two parts by a gap 25c (FIG. 8). In order that the size of the gap 25c is variable, the hook 25 is made of a flexible material. When the head 25a which is overall wedge-shaped is inserted into the slit 24a, the gap 25c narrows. When the head 25a reaches an upper end 24b of the slit 24a, the gap 25c returns to the original size to complete the engagement between the hook 25 and the slit 24a. The upper end 24b is configured to admit the head 25a of the hook 25. As a result, the heat sink 24 is vertically positioned by the head 25a and integrated with the semiconductor device 11 by being sandwiched between the back 27 and the resin mold 22. Like the second embodiment, the hook 25 may be formed on the frame 3 instead of on the resin mold 22.

Since the hook 25 formed on the resin mold 22 and the slit 24a formed in the heat sink 24 are thus engageable, the heat sink 24 is attached to the semiconductor device 21 in a single process. In addition, by the presence of the back 27, the heat sink 24 is more stably attached to the semiconductor device 21.

Figure 13:
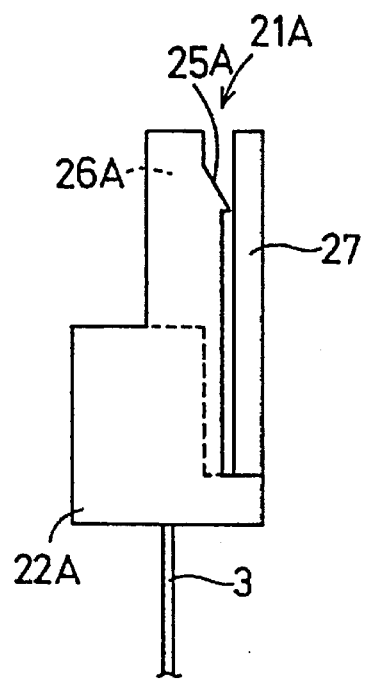
FIG. 13 is a side view of a semiconductor device of a fourth embodiment of the present invention.

FIG. 13 is a side view of a semiconductor device 21A of a fourth embodiment of the present invention. The fourth embodiment is the same as the third embodiment except that a hook 25A is formed integrally with a resin mold 22A. The resin mold 22A and the hook 25A are each divided into two parts by a gap 26A. Since the hook 25A is integrated with the resin mold 22A at a larger area, molding is easier and strength is more excellent.

Figure 14A:
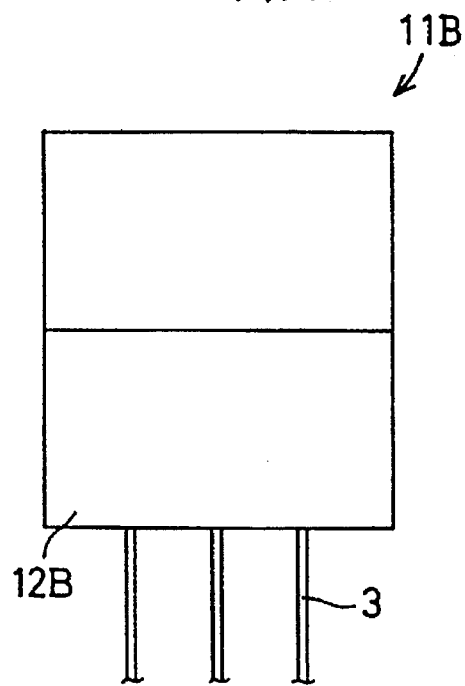
FIGS. 14A and 14B are a front and a side views of a fifth embodiment of the present invention.
Figure 14B:
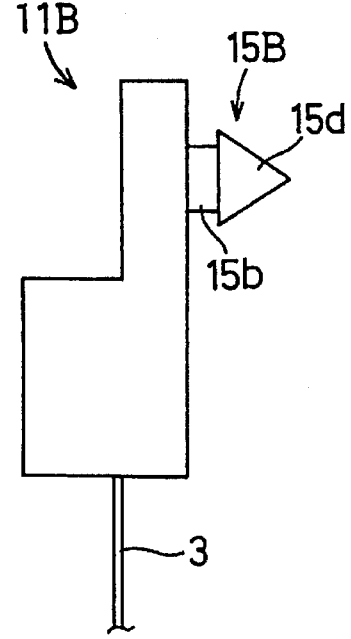
Figure 15B:
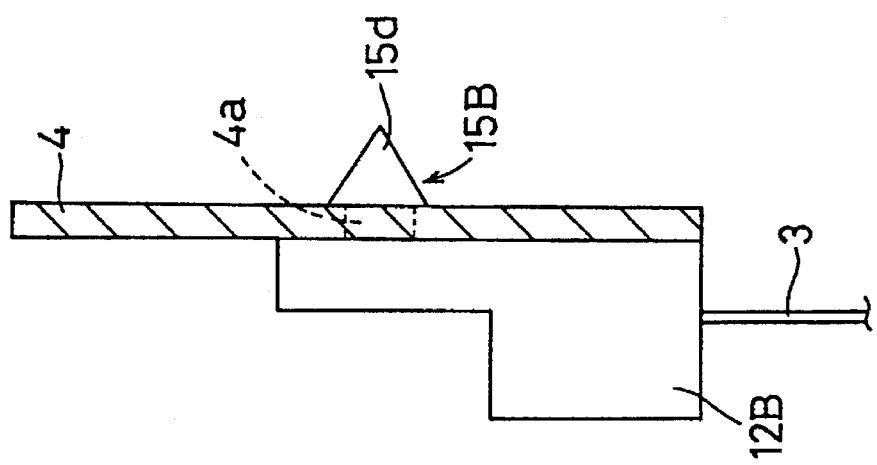
FIGS. 15A and 15B are a front and a side views showing a condition after the attachment in the fifth embodiment.
Figure 15A:
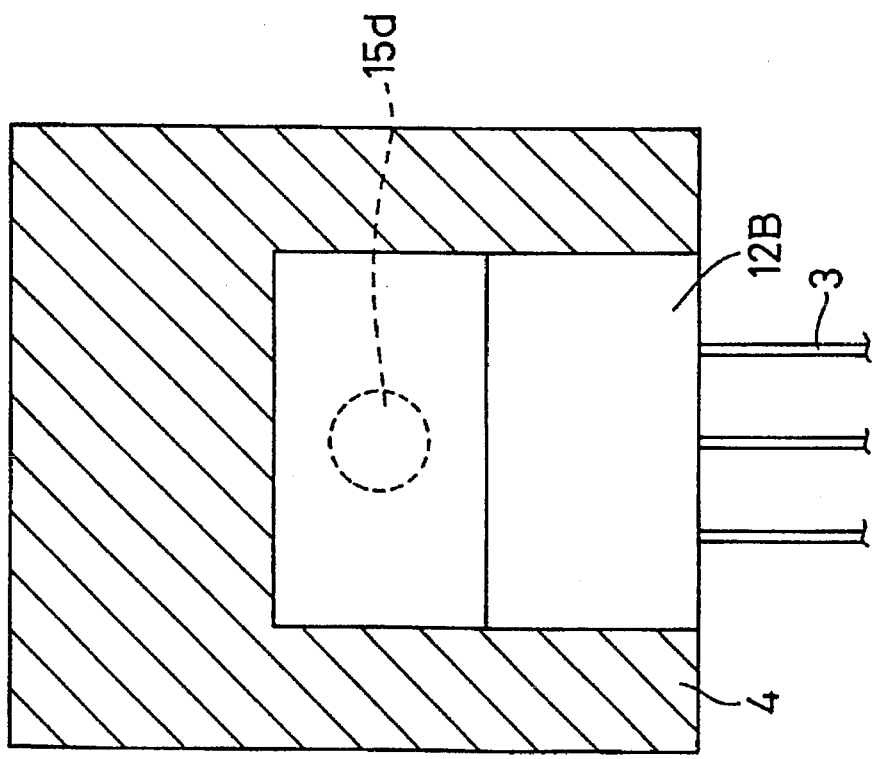

FIGS. 14A and 14B are a front view (FIG. 14A) and a side view (FIG. 14B) of a semiconductor device 11B of a fifth embodiment of the present invention. FIGS. 15A and 15B are a front view (FIG. 15A) and a side view (FIG. 15B) showing a condition after the attachment in the fifth embodiment. Although the heat sink 4 is hatched in FIGS. 15A and 15B, this hatching does not represent cross sections. The fifth embodiment is a simplification of the first embodiment and is the same as the structure of the first embodiment except that the gap 15c (FIGS. 3 and 4) is not formed at the head 15d. Specifically, in order to attach the heat sink 4 to the semiconductor device 11B in which the frame 3 is encapsulated in a resin mold 12B (made of e.g. epoxy resin), the fifth embodiment has a structure such that a pin 15B is formed integrally with the resin mold 12B and the hole 4a engageable with the pin 15B is formed integrally with the heat sink 4.

Thus, even though the gap 15c (FIG. 4) is not formed, the pin 15B can be engaged with the hole 4a by adjusting the size and configuration of the hole 4a and the elasticity and configuration of the head 15d in designing or manufacturing. Thus, the employment of the simplified head 15d not having the gap 15c reduces the cost.

Figure 16A:
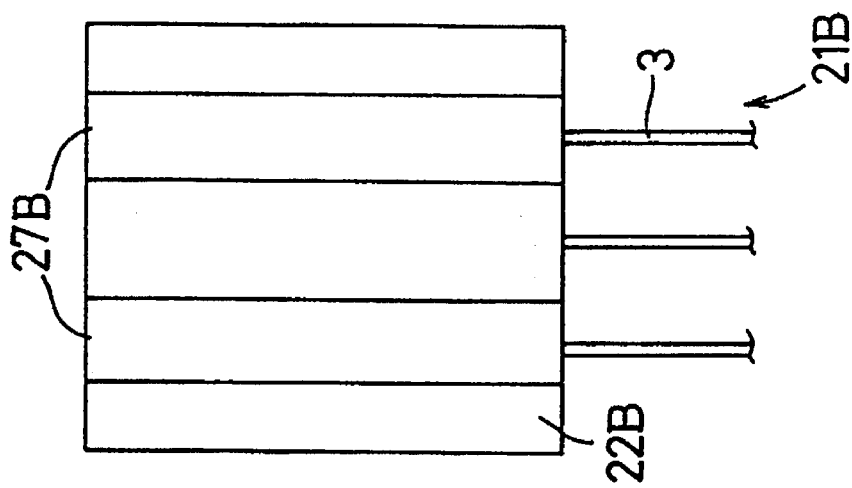
FIGS. 16A, 16B and 16C are a front, a side and a rear views of a semiconductor device of a sixth embodiment of the present invention.
Figure 16B:
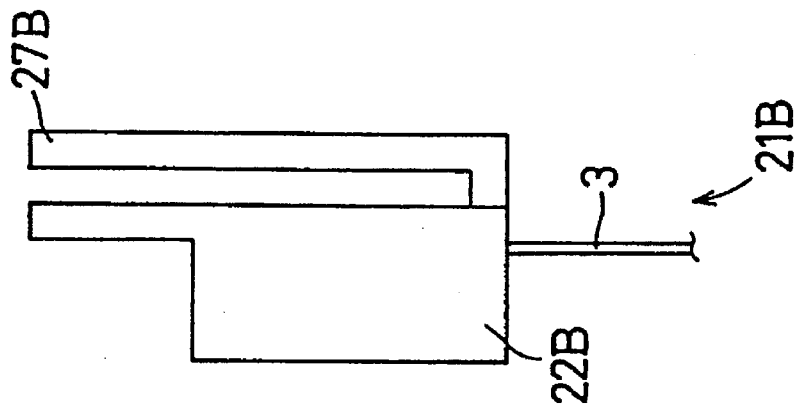
Figure 16C:
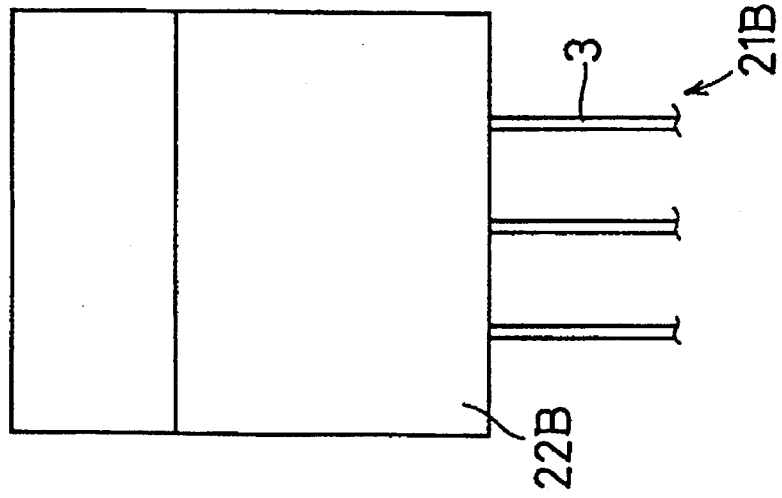
Figure 17:
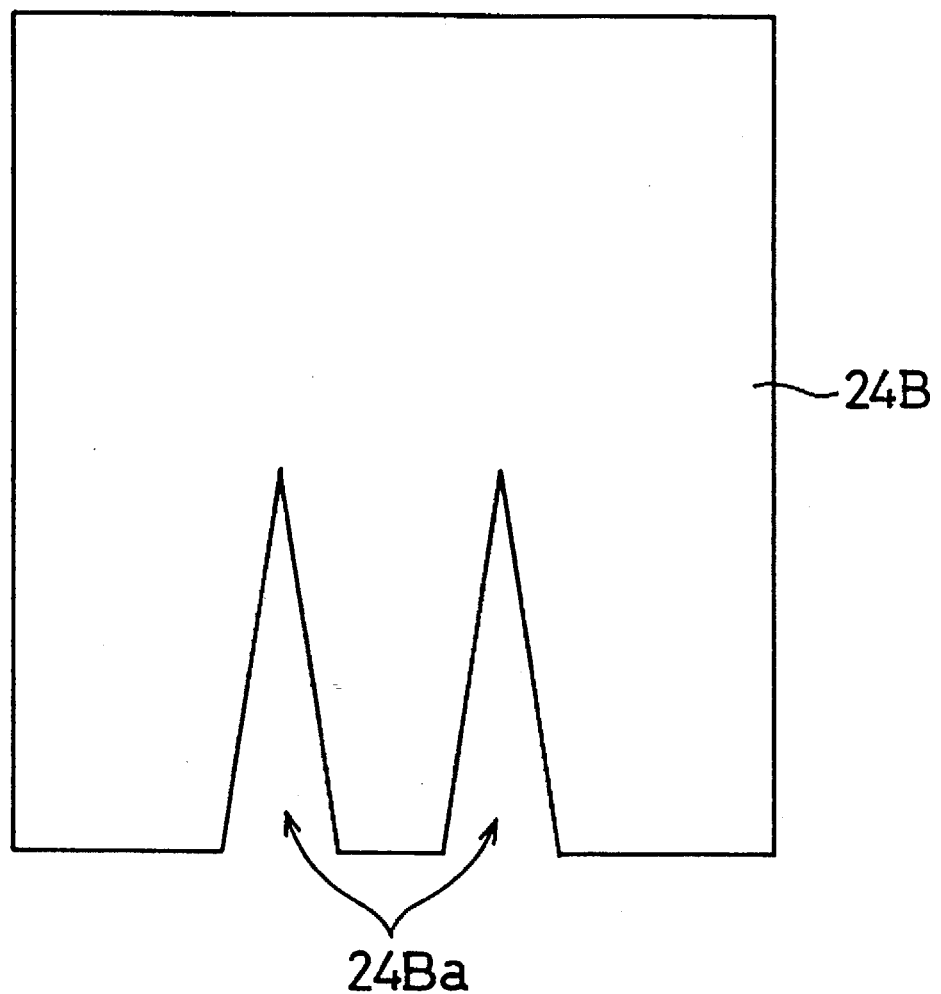
FIG. 17 is a front view of a heat sink of the sixth embodiment.
Figure 18:
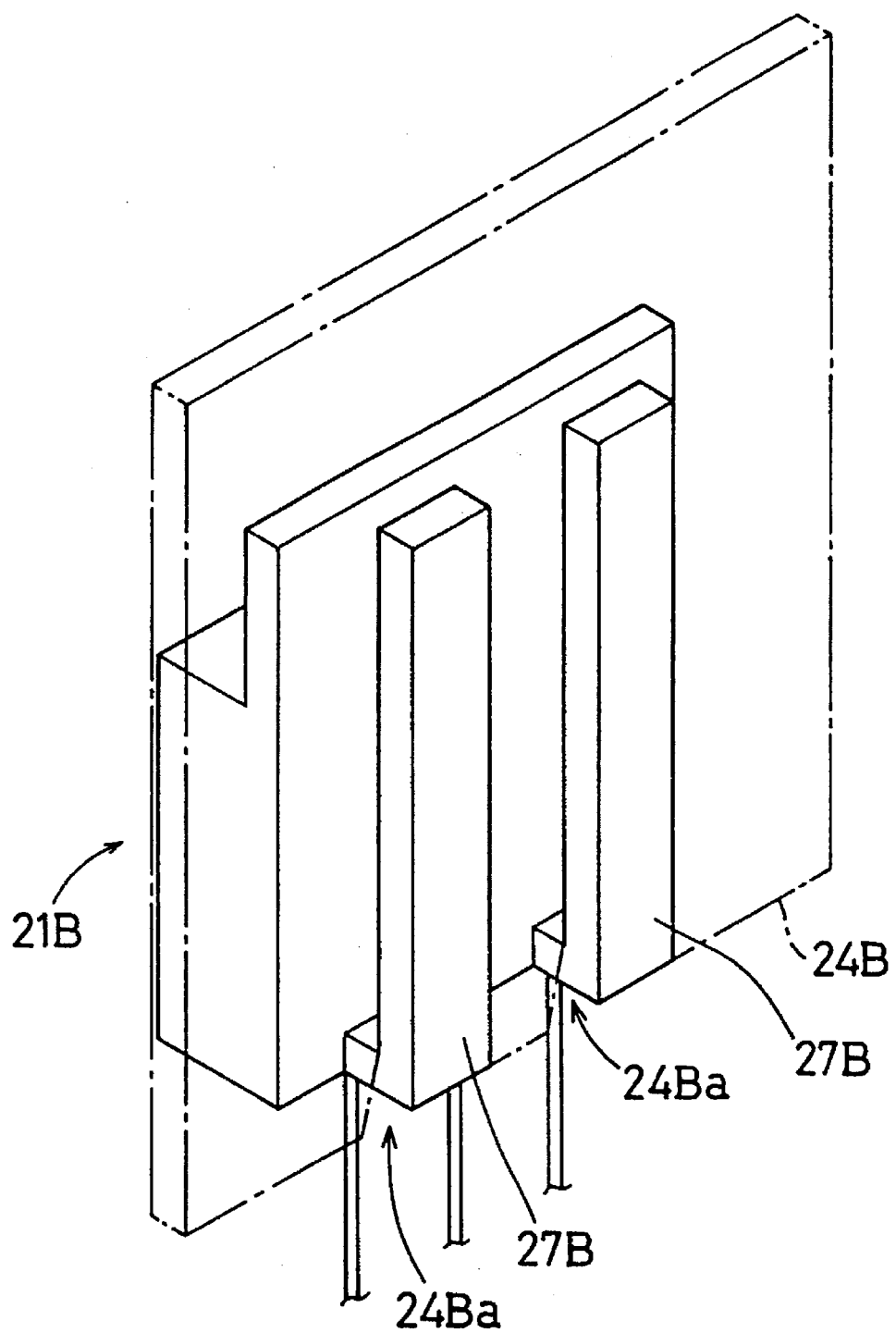
FIG. 18 is a perspective view showing a condition after the attachment in the sixth embodiment.
Figure 19C:
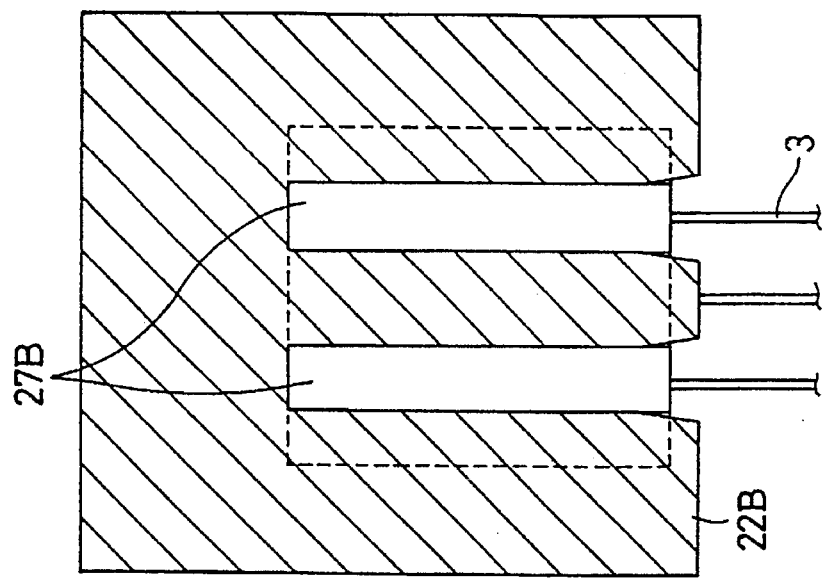
FIGS. 19A, 19B and 19C are a front, a side and a rear views showing the condition after the attachment in the sixth embodiment.
Figure 19B:
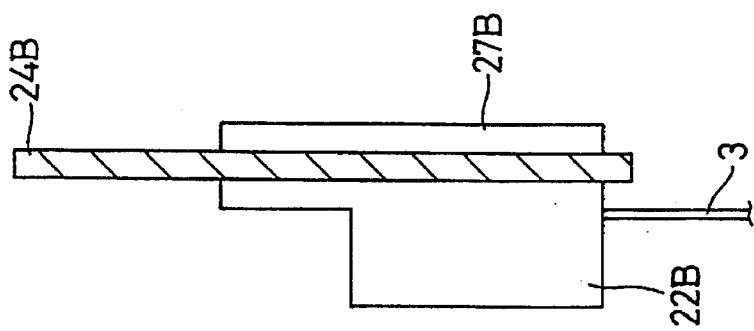
Figure 19A:
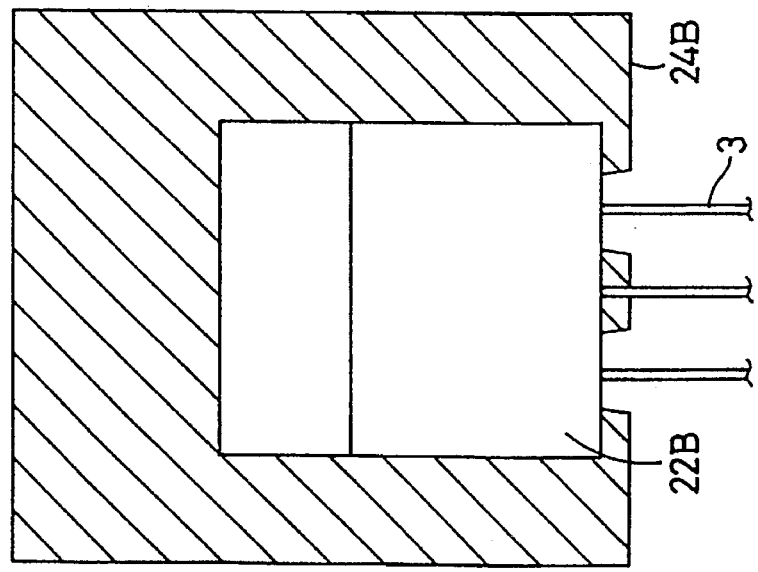

FIGS. 16A, 16B and 16C are a front view (FIG. 16A), a side view (FIG. 16B) and a rear view (FIG. 16C) of a semiconductor device 21B of a sixth embodiment of the present invention. FIG. 17 shows a heat sink 24B of the sixth embodiment. FIG. 18 is a perspective view showing a condition after the attachment in the sixth embodiment. In FIG. 18, the dash and dotted line represents the heat sink 24B. FIGS. 19A, 19B and 19C are a front view (FIG. 19A), a side view (FIG. 19B) and a rear view (FIG. 19C) showing the condition after the attachment in the sixth embodiment. Although the heat sink 24B is hatched in FIGS. 19A, 19B and 19C, this hatching does not represent cross sections.

The sixth embodiment is a simplification of the third embodiment and is the same as the structure of the third embodiment except that two backs 27B are provided instead of the hook 25 (FIG. 9, etc.) and that the heat sink 24B having two recesses 24Ba is used. Specifically, in order to attach the heat sink 24B to the semiconductor device 21B in which the frame 3 is encapsulated in a resin mold 22B (made of e.g. epoxy resin), the sixth embodiment has a structure such that a plurality of backs 27B are formed integrally with the resin mold 22B and the recesses 24Ba engageable with the backs 27B are formed integrally with the heat sink 24B.

As shown in FIGS. 18 and 19A to 19C, by engaging the heat sink 24B with the backs 27B at the recesses 24Ba, the heat sink 24B is fixed to the two backs 27B at the recesses 24Ba, so that it is integrated with the semiconductor device 21B. Since the backs 27B formed on the resin mold 22B and the recesses formed in the heat sink 24B are thus engageable, the heat sink 24B is attached to the semiconductor device 21B in a single process. Like the second embodiment, the backs 27B may be formed on the frame 3 instead of on the resin mold 22.

Figure 20:
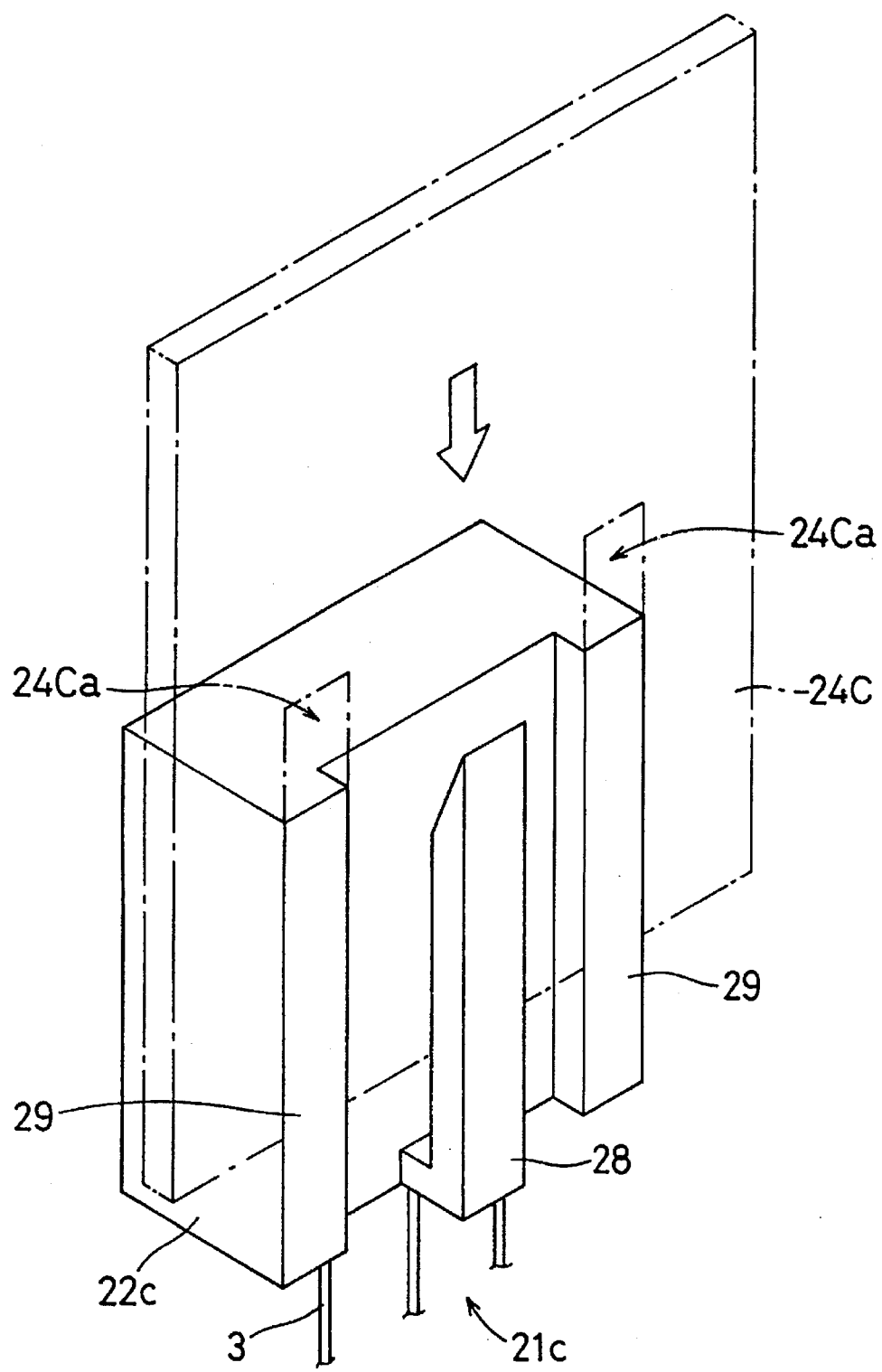
FIG. 20 is a view of assistance in explaining the attachment of a heat sink to a semiconductor device in a seventh embodiment of the present invention.
Figure 21D:
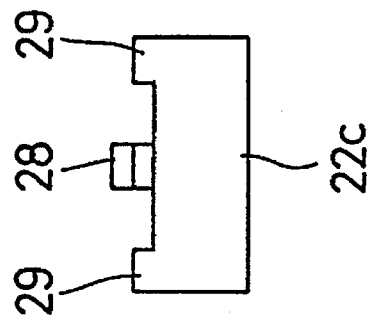
FIGS. 21A, 21B, 21C and 21D are a front, a side, a rear and an upper views of the semiconductor device of the seventh embodiment.
Figure 21C:
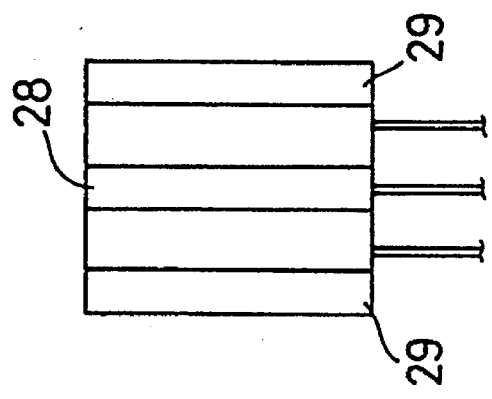
Figure 21B:
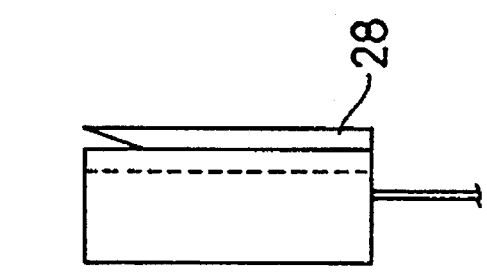
Figure 21A:
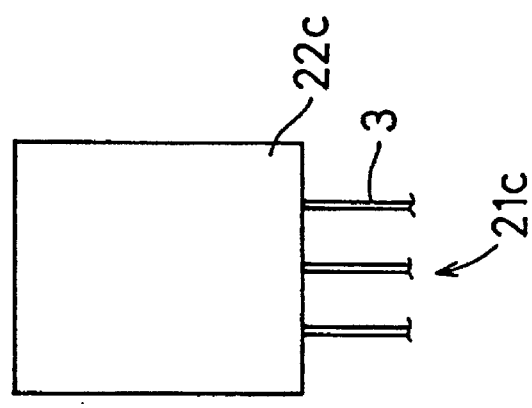
Figure 22A:
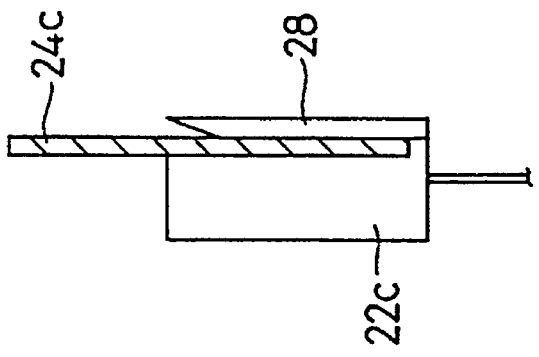
FIGS. 22A, 22B, 22C, 22D and 22E are a front, a rear, a side, an upper and a bottom views showing a condition after the attachment in the seventh embodiment.
Figure 22B:
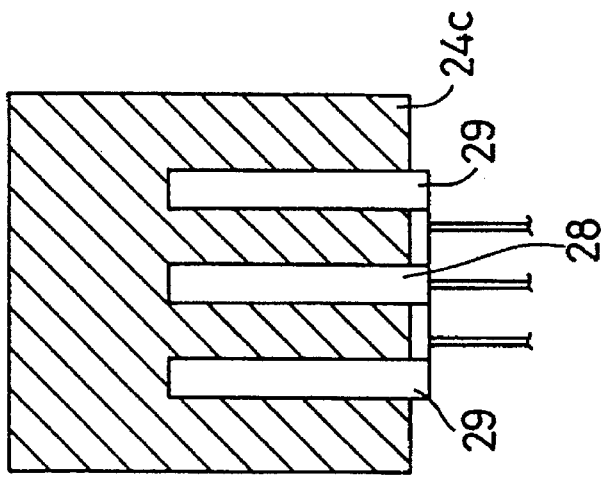
Figure 22C:
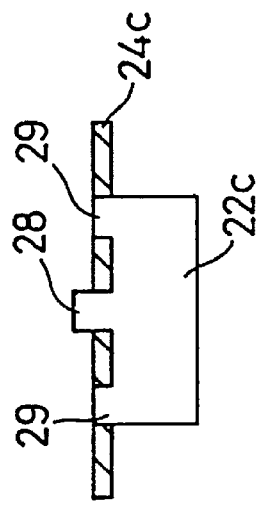
Figure 22D:
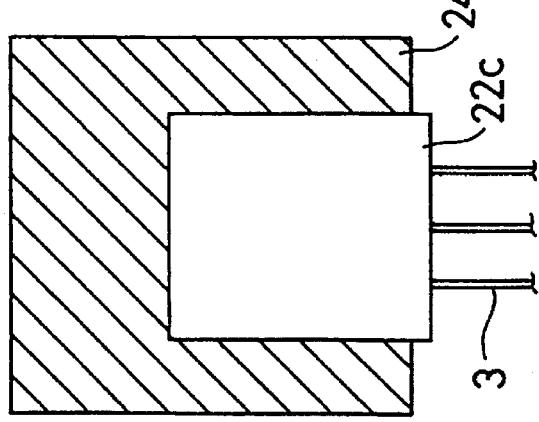
Figure 22E:
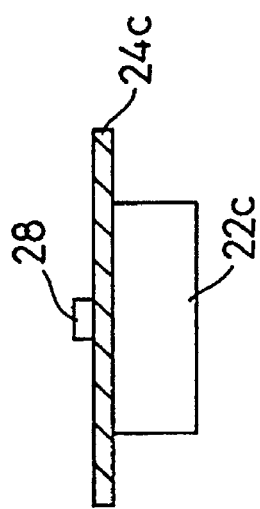

FIG. 20 is a perspective view showing an attachment of a heat sink 24c to a resin mold 22c in a seventh embodiment of the present invention. FIGS. 21A, 21B, 21C and 21D are a front view (FIG. 21A), a side view (FIG. 21B), a rear view (FIG. 21C) and an upper view (FIG. 21D) showing a condition before the attachment in the seventh embodiment. FIGS. 22A, 22B, 22C, 22D and 22E are a front view (FIG. 22A), a rear view (FIG. 22B), a side view (FIG. 22C), an upper view (FIG. 22D) and a bottom view (FIG. 22E) showing a condition after the attachment.

In order to attach the heat sink 24c to a semiconductor device 21c in which the frame 3 is encapsulated in the resin mold 22c (made of e.g. epoxy resin), the seventh embodiment has a structure such that a guide 29 and a hook 28 engageable with a lower end of the heat sink 24c are formed integrally with the resin mold 22c and a groove 24Ca engageable with the guide 29 is formed integrally with the heat sink 24c.

As shown in FIG. 20, by engaging the heat sink 24c with the Guide 29 at the groove 24Ca and with the hook 28 at the lower end of the heat sink 24c, the heat sink 24 is integrated with the semiconductor device 21C by being sandwiched between the hook 28 and IC side portions of the guide 29 and the resin mold 22c. Since the hook 28 and the guide 29 of the resin mold 22C and the lower end and the groove 24Ca of the heat sink 24c are thus engageable, the heat sink 24c is attached to the semiconductor device 21c in a single process. The hook 28 extends from a back surface of the resin mold 22c rearward and bends at 90 degrees to extend upward in parallel with the back surface of the resin mold 22c. Like the second embodiment, the hook 28 and the guide 29 may be formed on the frame 3 instead of on the resin mold 22c.

As described above, according to any of the above-described embodiments, the heat sink is easily attached to the semiconductor device in a single process, so that the time required for the attachment is reduced, the work efficiency improves and the manufacture cost is reduced. The circuit board for fixing the semiconductor device thereonto may be used also as the heat sink.

As described above, according to the present invention, a structure for attaching a heat sink to a semiconductor device is realized which enables a reduction in work process, an improvement in manufacture efficiency and a reduction in manufacture cost.

Obviously, many modifications and variations of the present invention are possible in light of the above teachings. It is therefore to be understood that within the scope of the appended claims, the invention may be practiced other than as specifically described.

What is claimed is:

1. A structure for attaching a heat sink to a semiconductor device in which a frame, having a semiconductor chip mounted thereon, is encapsulated in a resin mold so as to partly protrude therefrom, said structuring comprising:
    a hook and a back formed integrally with the resin mold; and
    a slit, engageable with the hook, formed integrally with the heat sink, and
    wherein when said slit of said heat sink is engaging with the hook, said heat sink is sandwiched between the resin mold and the back.

2. A heat sink attaching structure according to claim 1, wherein said back is formed to face one surface of a main body of the resin mold with a gap therebetween, said back connecting with the main body by a connecting part.

3. A heat sink attaching structure according to claim 2, wherein in the gap, the hook protrudes from the connecting part in parallel with the one surface and the back.

4. A heat sink attaching structure according to claim 3, wherein a slit is formed in the main body of the resin mold which faces the hook.

5. A heat sink attaching structure according to claim 1, wherein said hook is formed integrally with one surface of a main body of the resin mold, said hook facing the back with a gap therebetween, and wherein said back connects with the main body at an end thereof.

6. A structure for attaching a heat sink to a semiconductor device in which a frame, having a semiconductor chip mounted thereon, is encapsulated in a resin mold so as to partly protrude therefrom, said structuring comprising:
    a back extending from the resin mold by a connecting part so that a gap is present between the back and one surface of the resin mold; and
    a recess, engageable with the back, is formed in the heat sink.

7. A structure for attaching a heat sink to a semiconductor device in which a frame, having a semiconductor chip mounted thereon, is encapsulated in a resin mold so as to partly protrude therefrom, said structure comprising:
    a guide formed integrally within one surface of the resin mold;
    a hook extending vertically from the one surface of the resin mold and then, bending at 90 degrees to extend in parallel with the one surface; and
    a groove, engageable with the guide, formed in the heat sink, said hook engageable with a lower end of the heat sink.

8. A heat sink attaching structure according to claim 7, wherein said hook is located between two guides.

9. A semiconductor apparatus comprising:
    a semiconductor chip;
    a molding resin for encapsulating the semiconductor chip; and
    a plate attached to the molding resin for sinking heat, wherein the plate is fixed to the molding resin by
    a) a first surface formed on the molding resin, said first surface abutting on one surface of the plate and restricting a movement of the plate thereagainst;
    b) a back constituting a part of the molding resin, said back having a second surface facing the first surface, abutting on another surface of the plate and restricting the movement of the plate thereagainst;
    c) a hole formed in the plate; and
    d) a protrusion formed between the first surface and the second surface from the molding resin, said protrusion engaging with the hole and restricting the movement of the plate along the first surface.

10. A semiconductor apparatus according to claim 9, wherein the protrusion is formed on the first surface toward the second surface.

11. A semiconductor apparatus according to claim 9, wherein the protrusion is formed on a part of the molding resin between the first surface and the second surface, and the rotrusion has a head engaging with the hole and an elastic trunk, and
    wherein a slit is formed in the plate from an end to the hole for leading the head of the protrusion therethrough.

12. A semiconductor apparatus comprising:
    a semiconductor chip;
    a molding resin for encapsulating the semiconductor chip; and
    a plate attached to the molding resin for sinking heat, wherein the plate is fixed to the molding resin by
    a) a first surface formed on the molding resin, said first surface abutting on one surface of the plate and restricting a movement of the plate thereagainst;
    b) a back constituting a part of the molding resin, said back having a second surface facing the first surface, abutting on another surface of the plate and restricting the movement of the plate thereagainst;
    c) a recess formed in the plate at an end thereof; and d) a guide constituting a part of the molding resin, said post supporting the back, engaging with the recess and restricting the movement of the plate in a direction along the first surface.

13. A semiconductor apparatus according to claim 12, wherein a hook is formed on the first surface, said hook abutting on a side of the plate substantially orthogonal to the end where the recess is formed and restricting the movement of the plate in another direction along the first surface.

* * * * *